United States Patent [19]
Blalock et al.

[11] Patent Number: 5,493,259
[45] Date of Patent: Feb. 20, 1996

[54] HIGH VOLTAGE, LOW PASS FILTERING CONNECTOR WITH MULTIPLE GROUND PLANES

[75] Inventors: Donald R. Blalock, Colfax; Julian J. Ferry, Kernersville, both of N.C.; Clifford F. Lincoln, Atlanta, Ga.

[73] Assignee: The Whitaker Corporation, Wilmington, Del.

[21] Appl. No.: 398,796

[22] Filed: Mar. 6, 1995

Related U.S. Application Data

[63] Continuation of Ser. No. 960,555, Oct. 13, 1992, abandoned.

[51] Int. Cl.⁶ .............................. H03H 7/01; H01R 13/66
[52] U.S. Cl. .................... 333/182; 333/185; 439/607; 439/620; 361/328; 361/763; 361/765
[58] Field of Search ................... 333/12, 182, 181, 333/184, 185, 247; 361/400–402, 406, 412, 414, 328, 760–763, 780, 795, 765, 782; 174/52.2, 52.3, 250; 439/607, 620

[56] References Cited

U.S. PATENT DOCUMENTS

| | | | |
|---|---|---|---|
| 3,991,347 | 11/1976 | Hollyday | 361/400 |
| 4,126,840 | 11/1978 | Selvin | 333/184 X |
| 4,139,881 | 2/1979 | Shimizu et al. | 361/760 |
| 4,164,778 | 8/1979 | Sawairi et al. | 361/409 |
| 4,339,785 | 7/1982 | Ohsawa | 361/760 X |
| 4,578,737 | 3/1986 | Westermann | 361/308.1 |
| 4,617,586 | 10/1986 | Cuvilliers et al. | 333/247 X |
| 4,761,881 | 8/1988 | Bora et al. | 361/400 X |
| 4,814,943 | 3/1989 | Okuaki | 361/400 |
| 5,034,710 | 7/1991 | Kawaguchi | 333/185 |
| 5,082,457 | 1/1992 | Woolscheidt et al. | 333/183 X |

FOREIGN PATENT DOCUMENTS

| | | | |
|---|---|---|---|
| 0018110 | 1/1991 | Japan | 333/185 |
| 0018113 | 1/1991 | Japan | 333/185 |
| 0258101 | 11/1991 | Japan | 361/763 |

*Primary Examiner*—Benny T. Lee
*Assistant Examiner*—Justin P. Bettendorf

[57] ABSTRACT

The invention provides improved high voltage, low pass filtering connectors. The connectors described herein comprise an assembly having a low impedance path to ground for use in the connector. The assembly comprises a plurality of circuit elements which contribute a fixed amount of impedance to the ground path, a printed circuit board adapted to house the circuit elements, the printed circuit board further having a corresponding plurality of traces in electrical communication with the plurality of circuit elements wherein the traces are adapted to minimize in-line insertion loss to the circuit elements, and a plurality of ground planes in the printed circuit board electrically interfaced in the ground path for providing a low impedance path to ground for the signals bussed to the connector. Connectors described herein ensure efficient low pass filtering of signals at frequencies above the resonant frequency of the connector. Furthermore, the connectors described herein contain epoxy strips and adhesive coatings which prevent high voltage arcing from the circuit elements to other portions of the connector.

9 Claims, 4 Drawing Sheets

Equivalent Circuit Diagram

HIGH VOLTAGE, LOW PASS FILTERING CONNECTOR WITH MULTIPLE GROUND PLANES

This is a continuation of application Ser. No. 07/960,555, filed on Oct. 13, 1992 now abandoned.

FIELD OF THE INVENTION

This invention relates generally to connectors for use in electrical equipment. More specifically, this invention relates to high voltage connectors which provide low pass filtering of signals that are bussed through the connectors.

BACKGROUND OF THE INVENTION

Connectors for use in electrical equipment usually comprise several components which contribute to the electrical characteristics of the connector such as the connector's "insertion loss" and its filtering properties. Connectors also usually comprise an input/output network that is adapted to receive and buss the signals through the connector to an electrical device in the connector's output environment, and a printed circuit board which contains circuit elements that are adapted to ensure that the connector performs its required functions. The circuit elements also contribute to the electrical characteristics of the connector and may have both a parasitic inductance and a parasitic capacitance which adversely affect the electrical performance of the connector.

For instance, a parallel plate surface mounted capacitor will generally produce a parasitic inductance which contributes to lowering the resonant frequency of the connector. This parasitic inductance, if not correctly placed in series with a ground plane, will severely limit the frequency response of the connector and force the resonant frequency to be capped at a rather low value. Additionally, the particular printed circuit board which is used to surface mount such parallel plate capacitors in a connector also produces a parasitic inductance which, if not properly grounded, will adversely affect the frequency response of the connector by lowering the resonant frequency.

The printed circuit boards in a connector also contain circuit "traces" which electrically interface the circuit elements to the connector's input/output network. As known by those with skill in the art, a circuit trace is a conductive sheet of material, usually a copper-based alloy, that is fabricated on the circuit board and which provides a low impedance path for current to flow from the input/output network and through the circuit elements on the printed circuit board.

As with the other circuit components in the connector, the traces themselves produce a parasitic inductance which must be efficiently controlled in order to maximize the efficiency of the connector. Since the traces are typically electrically interfaced directly with the circuit elements on the circuit board, they are considered "in line" between the input/output network and the circuit elements, and they are in the direct electrical path of the signal which is bussed through the connector. Such an in-line arrangement produces an "insertion loss" which is partially a result of the parasitic inductance of the traces.

This insertion loss (measured in dB) prevents the connector from providing proper signal filtering characteristics in connector applications which require a particular frequency response. Accordingly, the properties of the particular circuit traces found on the printed circuit boards of the connector play a critical role in controlling the filtering characteristics of the connector.

Prior connectors have not been developed with the goal of minimizing the insertion loss and providing filtering characteristics which are useful for sensitive applications. Thus, prior connectors tend to be useful only in applications which are insensitive to the frequency content of the signal being bussed therethrough, and which can tolerate an insertion loss which would be otherwise unacceptable for highly sensitive data communications through a connector.

Connectors which utilize discrete circuit elements also run a high risk of surface tracking across the discrete components in high voltage applications. This is especially true with connectors that utilize surface mounted chip capacitors that have a tendency to build up a high voltage, thereby causing the chip capacitors to discharge. Surface tracking and high voltage arcing which these connectors experience are undesirable, and tend to degrade the quality of the signal being bussed through the connectors. When connectors having chip capacitors or other surface mounted circuit elements which tend to build up high voltages must be used in high voltage applications, the undesirable effects of surface tracking and arcing should be minimized. However, there has not heretofore been an adequate solution in the art to provide connectors with the ability to minimize arcing and surface tracking across discrete surface mount components.

Accordingly, there is a need in the art for high quality, electrical connectors which minimize the insertion loss, and which ensure high integrity bussing of input signals through the connector to the output environment. These connectors should also minimize surface tracking and arcing which will occur in high voltage applications. Such needs have not heretofore been fulfilled in the art.

SUMMARY OF THE INVENTION

The aforementioned long-felt needs are solved by connectors in accordance with the present invention, and by the methods of manufacturing connectors taught herein. In a preferred aspect of the invention, an assembly having a low impedance path to ground for high frequency noise signals for use in a connector that is adapted to bus signals from an input source to an output environment is provided. The assembly preferably comprises a plurality of circuit elements which contribute a fixed amount of impedance to the ground path and a printed circuit board adapted to mount the circuit elements, the printed circuit board further having a corresponding plurality of traces in electrical communication with the plurality of circuit elements wherein the traces are adapted to minimize in-line insertion loss to the circuit elements. The assembly further preferably comprises a plurality of ground planes in the printed circuit board electrically interfaced in the ground path for providing a low impedance path to ground for the signals bussed through the connector.

The aforementioned methods of manufacturing connectors in accordance with the invention provide efficient and economical industrial processes for making high performance connectors. Preferably, methods of manufacturing high voltage connectors with low insertion loss comprise the steps of fabricating a printed circuit board having a plurality of ground planes which are adapted to provide a low impedance path to ground for certain high frequency noise signals supplied to the connector, interfacing a plurality of discrete circuit elements on the printed circuit board, the discrete circuit elements contributing a fixed impedance to the ground path, fabricating a corresponding plurality of traces on the printed circuit board to electrically interface with the plurality of discrete circuit elements, and interfacing an input/output network to the printed circuit board.

Connectors and assemblies provided in accordance with the present invention are versatile, and ensure that the electrical systems to which they are mated perform in an efficient fashion. Furthermore, the connectors taught and claimed herein are economical to fabricate and achieve the goals of low insertion loss and high signal integrity. By minimizing the effects of surface tracking and arcing, connectors in accordance with the present invention bus signals therethrough with little to no noise degradation. Such results have not heretofore been achieved in the art, and provide solutions to long-felt needs which have heretofore been unfulfilled.

The invention will be better understood by reading the following detailed description of preferred embodiments in conjunction with the accompanying drawings.

DETAILED DESCRIPTION OF PREFERRED EMBODIMENTS

Figure 1:
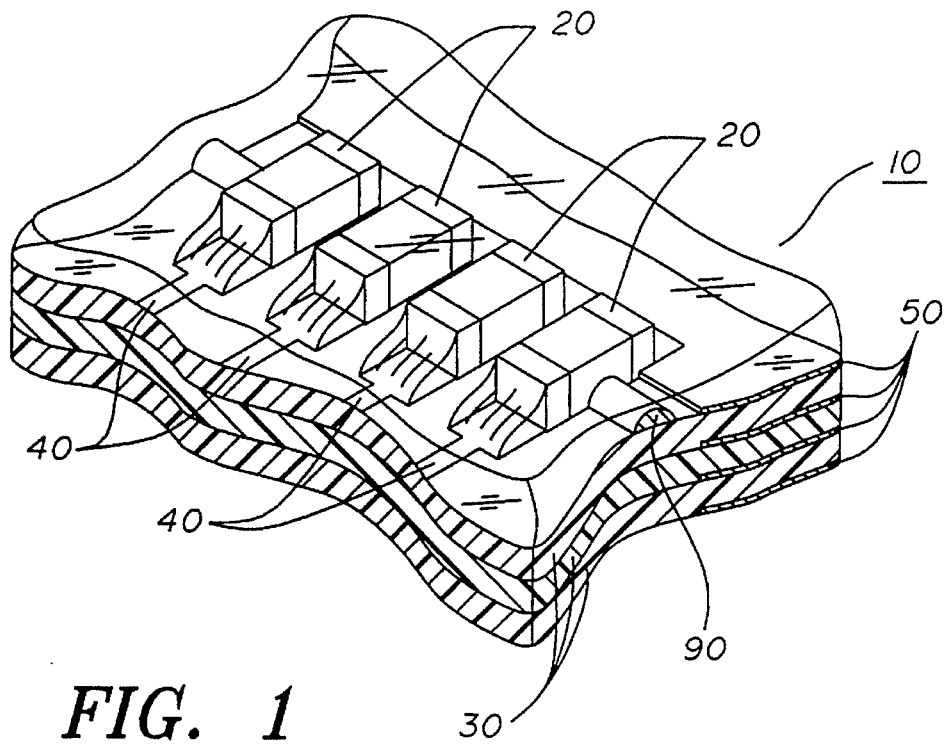
FIG. 1 is an isometric view of an assembly provided in accordance with the present invention having a low impedance path to ground for use in a connector.

Referring now to the drawings wherein like reference numerals refer to like elements, FIG. 1 is an isometric view of an assembly 10 having a low impedance path to ground for use in a connector that is adapted to bus signals from an input source to an output environment. The output environment is usually an electrical device which will utilize data in the signals bussed through the connector. The input source could be yet another electrical device, or a sensor which transduces signals into data signals.

The assembly 10 preferably comprises a plurality of circuit elements shown generally at 20 which will contribute a fixed amount of impedance to the ground path between the circuit elements 20 and a ground in a printed circuit board 30. The printed circuit board 30 is adapted to mount the circuit elements 20. The printed circuit board 30 further comprises a corresponding plurality of traces shown generally at 40 that are in electrical communication with the plurality of circuit elements 20, wherein the traces are adapted to minimize the in-line insertion loss to the circuit elements 20. In accordance with a preferred aspect of the invention, the printed circuit board 30 yet further comprises a plurality of ground planes shown generally at 50 which are electrically interfaced in the ground path and which provide a low impedance path to ground for the signals bussed through the connector.

The circuit elements 20, printed circuit board 30 and circuit traces 40 all contribute to the electrical characteristics of a connector which will use assembly 10. The circuit elements are preferably surface mounted capacitors having parallel plates therein that produce a characteristic capacitance for assembly 10. More preferably, each of the surface mounted capacitors 20 has a capacitance of about 1200 pf. Since these capacitors are not ideal elements, they each will contribute a certain amount of parasitic inductance, $L_c$, to the assembly. The printed circuit board 30 is also not ideal, and contributes parasitic inductance, $L_b$, to assembly 10. It has been found that when the capacitance of each capacitor 20 is approximately 1200 pf, $L_c$ is about 0.6 nano H, and $L_b$ is about 6.4 nano H.

The traces 40 also produce a certain amount of parasitic inductance, $L_t$. This is also called a "line inductance" and is a major factor in contributing to the insertion loss of a connector when the signal is bussed through a connector utilizing the assembly 10. In general, the thinner the width and thickness of a trace 40, the greater the $L_t$ value is for that trace. This in turn reduces the insertion loss since the parasitic inductance of the trace generates an input impedance for the signals bussed through the input network to the capacitors 20 which tends to "clamp" the insertion loss at a particular value. Since the connectors utilizing assembly 10 will exhibit a resonant frequency that is dependent upon the parameters $L_c$, $L_b$ and $L_t$, controlling the trace widths and thicknesses allows the insertion loss to be clamped at frequencies higher than the resonant frequency of the connector.

For example, it has been found that decreasing the width of a trace 40 will clamp the insertion loss at approximately 10 dB at 150 MHz input frequency or higher. It is also possible to "interleave" the traces 40 on printed circuit board 30 to suppress the incoming signal by approximately an additional 5 dB. Interleaving the traces 40 and bringing the traces in closer proximity to the ground planes 50 reduces the overall inductance of the printed circuit board 30, thereby alleviating the adverse effect of increasing $L_t$ by narrowing the trace width and thickness. These are advantageous results and provide a low pass filter capability for connectors provided in accordance with the present invention at high resonant frequencies. By ensuring that the trace length is below about two inches, and that the trace width is below about 18 mils, the line inductance can be kept below about 16 nano H above 100 MHz. These values also aid in keeping the resonant frequency for the connector above about 60 MHz.

Figure 2:
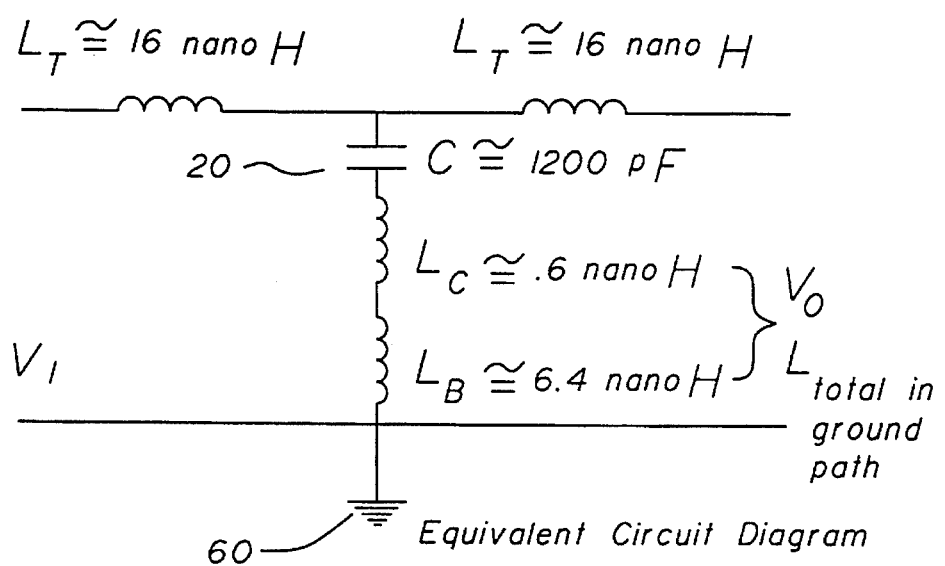
FIG. 2 is an equivalent circuit diagram for the assembly of FIG. 1.

Referring to FIG. 2, an equivalent circuit diagram for the assembly of FIG. 1 is illustrated. The input voltage, $V_i$, is impressed on the connector through an input network (not shown in FIGS. 1 and 2) and onto capacitor 20 so that a signal can be bussed through a connector utilizing assembly 10. In the exemplary embodiment of FIG. 2, the capacitor has a capacitance of 1200 pf, and $L_c$ is approximately 0.6 nano H, while $L_b$ is approximately 6.4 nano H. Thus, the total inductance in the ground path is simply $L_c+L_b$, or about 7.0 nano H. The total reactance to ground 60 through capacitor 20 and printed circuit board 30 is the sum of the individual reactances produced by $L_c$, $L_b$ and C. Thus, the resonant frequency, $f_o$, of the circuit can be calculated as follows:

$$f_o = \frac{0.1592}{(LC)^{1/2}} =$$

$$\frac{0.1592}{(0.6 \times 10^{-9} + 6.4 \times 10^{-9})(1200 \times 10^{-12})^{1/2}}.$$

This produces a resonant frequency of approximately 55 MHz when there is 7.0 nano H in the ground path. When there is more inductance in the ground path, that is when $L_b$ is higher, for example about 10.0 nano H, the resonant frequency can be calculated according to the above formula to be about 45 MHz.

In accordance with the invention, adding additional ground planes 50 to printed circuit board 30 reduces the inductance in the printed circuit board 30, thereby increasing the resonant frequency for the connector. The resonant frequency is increased in this fashion since by providing additional ground planes 50 to the assembly 10, the signal being bussed through the connector utilizing assembly 10 will "see" a better ground plane, and therefore $L_b$ is effectively reduced in this manner.

By increasing the resonant frequency with the addition of ground planes and clamping the insertion loss above the resonant frequency by controlling the size of traces 40, a very efficient low pass filter connector is achieved. Such results have not heretofore been achieved in the art and allow connectors provided in accordance with the present invention to provide low pass filtering and low insertion loss at high voltages and high resonant frequencies. This is particularly useful for high voltage applications and high speed data communications applications.

Figure 3:
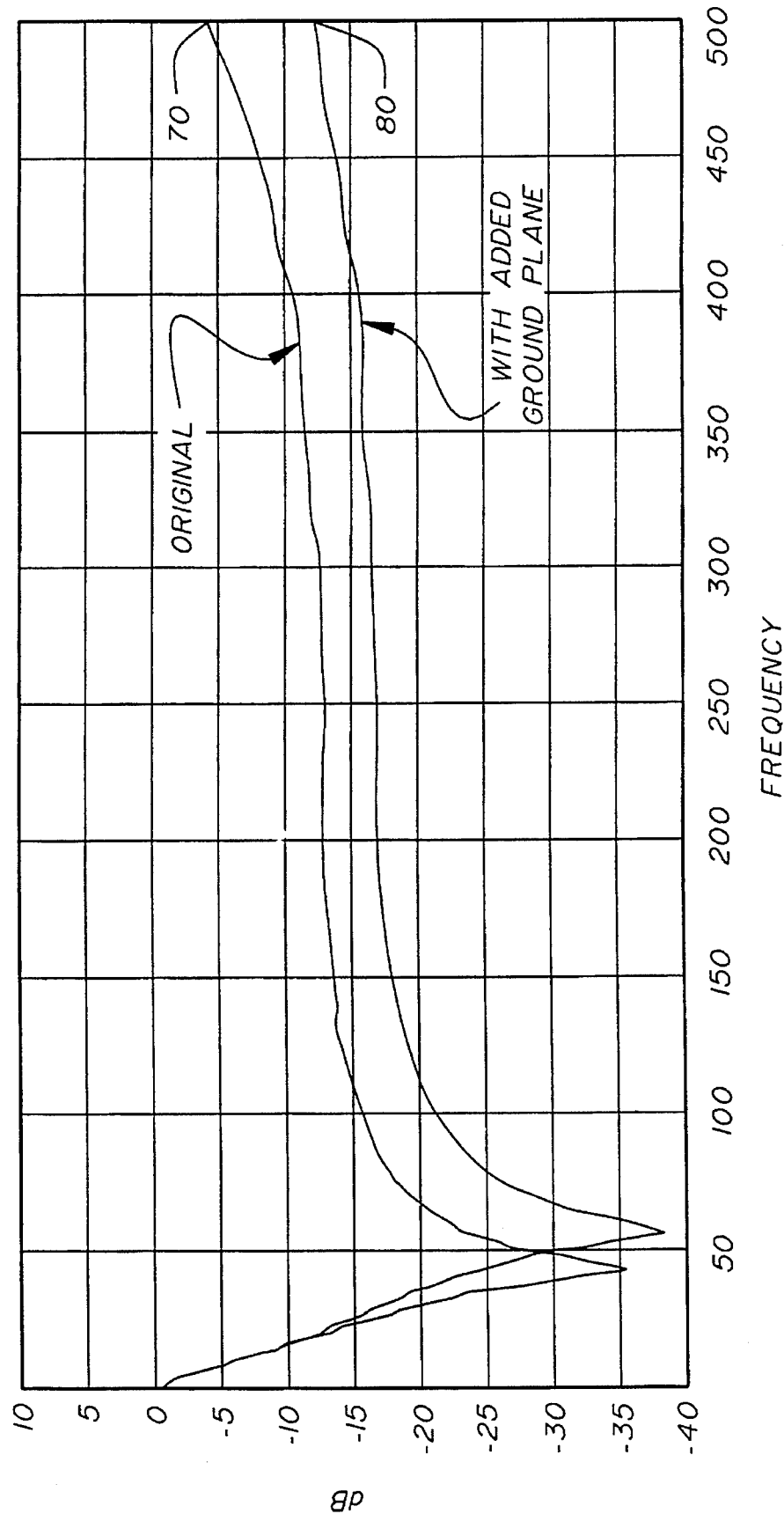
FIG. 3 is a graph of connector gains showing insertion loss curves for connectors having ground planes.

Referring now to FIG. 3, insertion loss curves for a connector utilizing an assembly substantially as that shown in FIG. 1 is illustrated. On the x axis, the frequency in MHz is plotted, while on the y axis, the insertion loss in dB is shown. The upper curve 70 is the insertion loss for a connector having a printed circuit board that has a total inductance in the ground path of about 10 nano H, that is two ground planes. The lower curve 80 illustrates the insertion loss for a connector having a circuit board with a total inductance to ground of about 7 nano H, that is, four ground planes. It can be seen by the insertion loss curves of FIG. 3 that the upper curve 70 having a resonant frequency of 45 MHz clamps the insertion loss at about −10 dB for a 150 MHz input frequency or higher. This corresponds to a trace inductance $L_t$ of about 16 nano H. Interleaving the traces will suppress the incoming signal by approximately an additional 5 dB. Curve 80 having a resonant frequency of about 55 MHz clamps the signal at about −18 dB for 150 MHz and above.

In a typical 64 pin connector which comprises 64 capacitors, each of the 64 capacitors will generate some parasitic inductance for the connector. At pin 47, which is the mid-capacitor range for such a connector, the inductance of the capacitance is added in series and has been found to be approximately 6.11 nano H overall. Thus adding a sufficient number of ground planes will bleed this parasitic inductance to ground and improve the overall efficiency of the conductor by increasing the resonant frequency and clamping the insertion loss at frequencies higher than the resonant frequency. This takes advantage of a printed circuit board's inherent reactance for filtering, thereby allowing utilization of discrete surface mount chip capacitors in high voltage applications. It has been found that connectors in accordance with the present invention are useful at well over 1000 volts root mean squared ($V_{rms}$) or over 1500 volts DC. Such results have not heretofore been achieved in the art.

Figure 4:
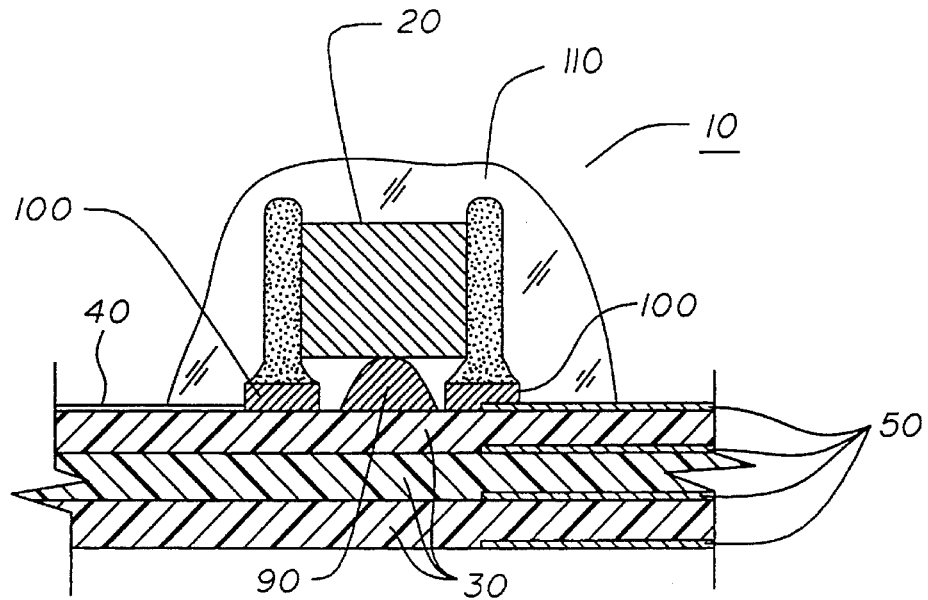
FIG. 4 is an elevational view of a connector provided in accordance with the present invention having an epoxy strip between surface mounted circuit elements and an adhesive covering.
Figure 5:
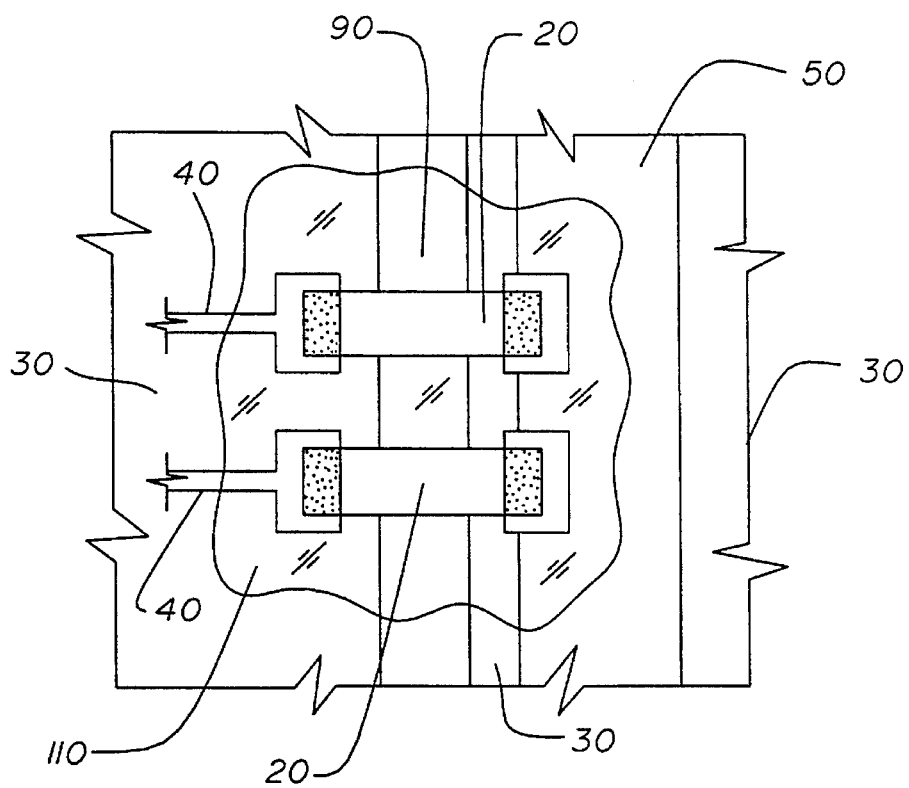
FIG. 5 is a plan view of the connector of FIG. 4.

In a further preferred aspect of the invention, the connectors described herein prevent over surface arcing across the surface mounted circuit elements. Referring to FIGS. 4 and 5, a further preferred embodiment of an assembly having a printed circuit board 30 with a plurality of ground planes is illustrated. The circuit element 20 is preferably a surface mounted chip capacitor. As discussed above, in high voltage applications there is a strong possibility that an arc will discharge from the printed circuit board side of the chip capacitor 20 to the printed circuit board itself or some other portion of the connector utilizing assembly 10. This is an extremely undesirable effect which is a consequence of the connector being used in high voltage applications.

In order to prevent an arc from occurring, it is desirable to place a strip of epoxy 90 on printed circuit board 30 between the capacitor 20 and printed circuit board 30. It is further preferably desirable to place the uncured epoxy strip 90 on printed circuit board 30 before placing surface mount capacitor 20 on the circuit board 30.

By placing the surface mount capacitor 20 on top of the uncured epoxy strip 90, it is ensured that no air gap or other contaminant will exist on the lower side, that is the printed circuit board 30 side, of the surface mount capacitor 20. After the surface mount capacitor 20 is placed on the circuit board 30, the epoxy strip is cured prior to solder reflow which firms and fixes the surface mount capacitor to the solder joints 100.

In even further preferred aspects of the invention, it is desirable to place an adhesive overcoat 110 over the surface mount capacitor 20 to encase the surface mount capacitor 20 within an adhesive barrier. This further prevents surface tracking and over voltage arcing from occurring.

The adhesive barrier is an insulator which prevents arcing from surface mounted capacitor 20 to other portions of the connector. The adhesive will preferably be transparent at high frequencies, but will be a good insulator in the frequency range of interest in which the connector of the present invention will be used.

The more preferred adhesive will have an insulation covering rating of between 100 and 1,000 volts per mil, and more preferably will have an insulation covering rating of about 800 volts per mil. In a typical 15 mil adhesive coat, the over voltage surface tracking protection will therefore be in excess of 12,000 volts. An adhesive which has been found most useful to prevent surface tracking is available from the LOCTITE Corporation of Newington, Conn., under the trade designation LITE-TAK 376. This adhesive is an acrylic, ultraviolet curable insulating adhesive with a dielectric constant ($\epsilon_o$) of about 3.41 at 10 KHz. Furthermore, the dissipation factor for this adhesive at 10 KHz is negligible.

Figure 6:
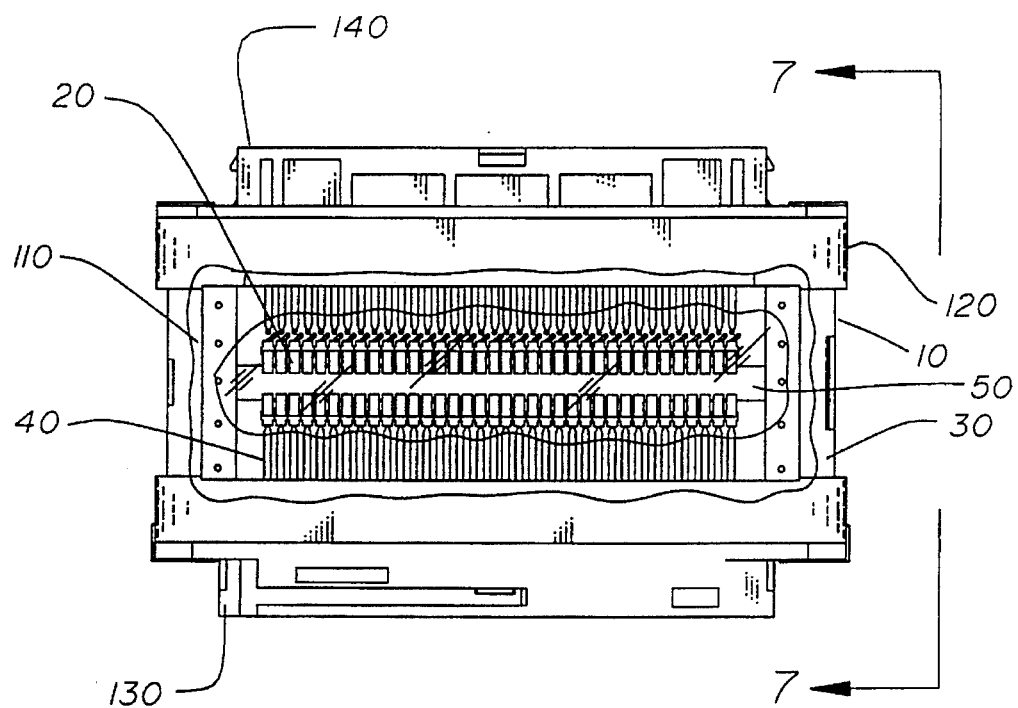
FIG. 6 is a plan view of a connector provided in accordance with the present invention.
Figure 7:
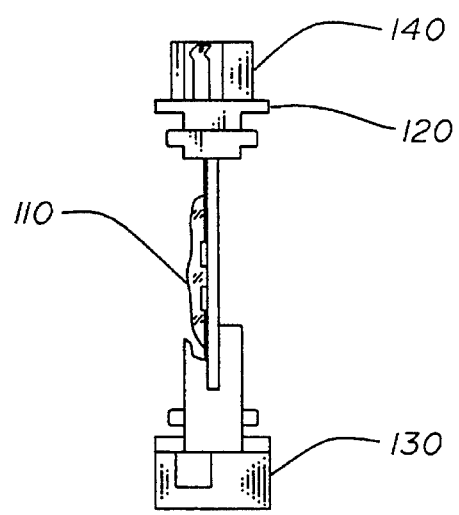
FIG. 7 is an elevational view of the connector of FIG. 6 taken along the 7—7 line.

The connector of FIGS. 6 and 7 preferably utilizes an assembly 10 as previously described having surface mounted chip capacitors 20 mounted on printed circuit board 30. The connector further preferably comprises a housing 120 which holds the assembly 10 in a secure fashion within the connector. The connector also comprises an input/output interface 130 which is electrically connected to the printed circuit board 30 for receiving and outputting the signals which will be bussed through the connector 20. A similar input/output interface 140 on an opposite side of the connector from the first input/output interface 130 is also electrically connected to the printed circuit board 30 for receiving and outputting signals which are bussed through the connector.

The input/output interfaces 130 and 140 preferably comprise standard connector contacts which are in electrical contact with the traces 40 on printed circuit board 30. The contacts in input/output networks 130 and 140 grasp corresponding connecting elements or in an input source in the outside environment of the connector.

The epoxy strips (not shown in FIGS. 6 and 7) and adhesive overcoats 110 prevent surface tracking and arcing from surface mounted chip capacitors 20 to the printed circuit board 30 and other parts of the connector. Furthermore, since the connectors of FIGS. 6 and 7 utilize an assembly which is designed and constructed substantially as described above with a plurality of ground planes, narrow and thin trace widths, and low printed circuit board inductance, the connector provides excellent low pass filtering characteristics at high resonant frequencies as well as clamping of the insertion loss at frequencies higher than the resonant frequency of the connector. Such results have not heretofore been achieved in the art and allow the connector shown in FIGS. 6 and 7 to perform with high efficiency and integrity in high voltage applications well above about 1000 volts $_{rms}$, or about 1500 volts dc.

Thus, the connectors described herein are highly efficient high voltage, low pass filtering components which take advantage of the filtering properties created by the inherent reactance of printed circuit boards found therein. Additionally, the low insertion loss achieved with these connectors allows the connectors to perform with superior electrical integrity, and in a manner which causes the signals bussed therethrough to be received by devices which will utilize the signals with little to no noise degradation. These results ensure that connectors provided in accordance with the present invention achieve superior electrical characteristics.

There have thus been described high voltage, low pass filtering connectors provided in accordance with the present invention. While preferred embodiments have been described and disclosed, it will be recognized by those with skill in the art that modifications are within the true spirit and scope of the invention. The appended claims are intended to cover all such modifications.

What is claimed is:

1. A low-pass filter electrical connector system for bussing a signal therethrough and for providing a low impedance path to ground, comprising:

a connector housing;

a first input/output interface device mounted on said housing;

a second input/output interface device mounted on said housing;

a printed circuit board structure mounted in said connector and having a first printed circuit board layer of insulating material along one of its major surfaces;

a plurality of capacitors, each of said capacitors having a first terminal and a second terminal, and each capacitor being mounted on said printed circuit board structure adjacent to said layer; and a set of conductive traces on said first printed circuit board layer, each of said traces being electrically connected between said first input/output interface device and said second input/output interface device so as to be in the direct electrical path of the signal bussed through the connector;

each of said conductive traces being operative to pass electrical signals through said connector between said first input/output interface device and said second input/output interface device;

a ground plane structure integral with said printed circuit board structure and including a plurality of conductive, substantially mutually-confronting ground planes extending parallel to each other and separated from each other by said layer of insulating material wherein each of said capacitors is in the ground path and contributes a fixed amount of impedance to the ground path by being connected across a separate one of said plurality of traces and said ground plane structure such that said first terminal of each of said capacitors is electrically connected to a one of said set of traces and said second terminal of each of said capacitors is electrically connected to said ground plane structure.

2. The connector system of claim 1, wherein said ground plane structure comprises at least four ground planes.

3. The connector system of claim 1, wherein said ground plane structure comprises at least three ground planes.

4. The connector system of claim 3, wherein said capacitors are surface-mounted on said printed circuit board structure.

5. The connector system of claim 1, also comprising a high-voltage insulating epoxy strip disposed along the surface of said printed circuit board structure and contacting the underside of said capacitors.

6. The connector system of claim 5, comprising also an adhesive layer of a high-voltage insulating material extending over said capacitors and the adjacent circuit board surface, for insulating said capacitors against arcing.

7. The connector system of claim 6, wherein said adhesive has a dielectric constant of about 3.41 at about 10 KHz.

8. The connector system of claim 1, wherein said ground plane structure exhibits an inductance of less than about 7 nano H.

9. The connector system of claim 8, wherein said connector exhibits a resonant frequency of substantially more than 45 MHz.

* * * * *